(12) United States Patent
Daly et al.

(10) Patent No.: US 8,193,046 B2
(45) Date of Patent: Jun. 5, 2012

(54) JUNCTION FIELD EFFECT TRANSISTOR

(75) Inventors: Paul Malachy Daly, Limerick (IE);
Andrew David Bain, Limerick (IE);
Derek Frederick Bowers, Los Altos Hills, CA (US); Anne Maria Deignan, Limerick (IE); Michael Thomas Dunbar, San Jose, CA (US); Patrick Martin McGuinness, Limerick (IE); Bernard Patrick Stenson, Limerick (IE); William Allan Lane, Cork (IE)

(73) Assignee: Analog Devices, Inc., Norwood, MA (US)

( * ) Notice: Subject to any disclaimer, the term of this patent is extended or adjusted under 35 U.S.C. 154(b) by 135 days.

(21) Appl. No.: 12/611,052

(22) Filed: Nov. 2, 2009

(65) Prior Publication Data

US 2011/0101424 A1  May 5, 2011

(51) Int. Cl.
*H01L 21/337* (2006.01)
(52) U.S. Cl. ............... 438/186; 438/194; 438/195
(58) Field of Classification Search .......... 438/186, 438/194, 195, 299, 301, 942, 945
See application file for complete search history.

(56) References Cited

U.S. PATENT DOCUMENTS

| 4,337,473 A | 6/1982 | Nishizawa |
| 4,452,646 A | 6/1984 | Zuleeg |
| 4,648,174 A * | 3/1987 | Temple et al. ............. 438/514 |
| 5,418,392 A | 5/1995 | Tanabe |
| 5,543,643 A | 8/1996 | Kapoor |
| 5,631,176 A * | 5/1997 | Kapoor ............... 438/195 |
| 6,153,453 A | 11/2000 | Jimenez |
| 7,495,347 B2 * | 2/2009 | Raisanen et al. ......... 257/797 |
| 2004/0164379 A1 * | 8/2004 | Raisanen et al. ......... 257/607 |

FOREIGN PATENT DOCUMENTS

| EP | 0660419 | 6/1995 |
| JP | 2000174035 | 6/2000 |
| WO | WO 2007/075759 A2 | 7/2007 |

OTHER PUBLICATIONS

International Search Report and Written Opinion dated Jan. 27, 2011 for International Appl. No. PCT/US2010/052700, filed Oct. 14, 2010.
U.S. Appl. No. 12/611,055, filed Nov. 2, 2009.
Written Opinion mailed on Jan. 20, 2012 for International Application No. PCT/US2010/052700, filed on Oct. 14, 2010, 6 pages.
Stengl R. et al; "Variation of Lateral Doping—A New Concept to Avoid High Voltage Breakdown of Planar Junctions", International Electro Devices Meeting. Washington, Dec. 1-4, 1985; Washington, IEEE, US, vol. -, Jan. 12, 1985 pp. 154-157, XP002013050.

* cited by examiner

*Primary Examiner* — Kevin M Picardat
(74) *Attorney, Agent, or Firm* — Knobbe, Martens, Olson & Bear, LLP

(57) ABSTRACT

A junction field effect transistor having a drain and a source, each defined by regions of a first type of semiconductor interconnected by a channel, and in which a dopant profile at a side of the drain facing the channel is modified so as to provide a region of reduced doping compared to a body region of the drain. The region of reduced doping and the body region can be defined by the same mask and doping step, but the mask is shaped to provide a lesser amount and thus less depth of doping for the region of reduced doping.

7 Claims, 10 Drawing Sheets

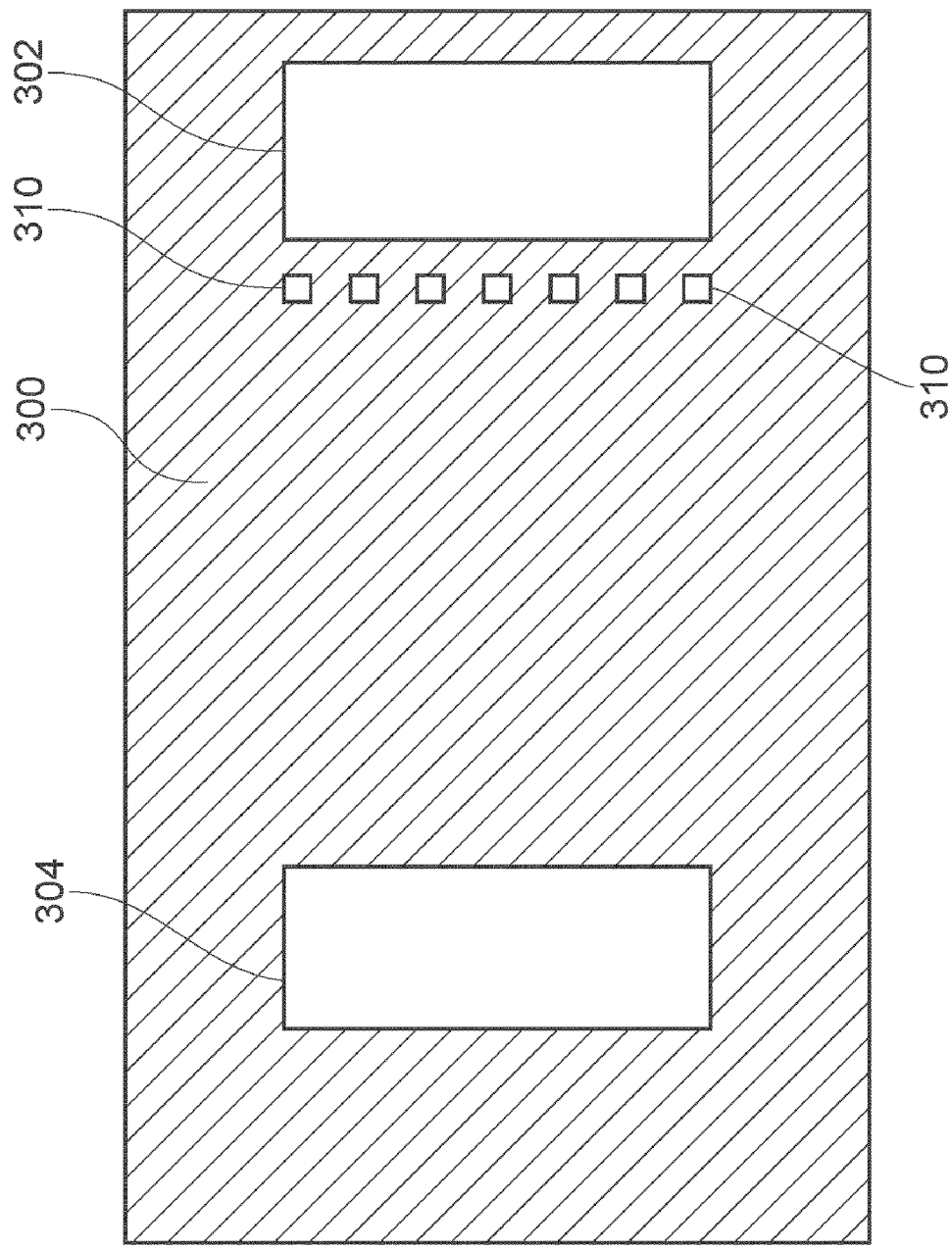

JUNCTION FIELD EFFECT TRANSISTOR

REFERENCE TO RELATED APPLICATION

This application is related to application Ser. No. 12/611,055, filed on even date herewith, entitled IMPROVED JUNCTION FIELD EFFECT TRANSISTOR.

FIELD OF THE INVENTION

The invention relates to an improved junction field effect transistor, and in particular to a way of reducing gate current.

BACKGROUND OF THE INVENTION

Junction field effect transistors, JFETs, can be fabricated using fabrication process which are similar to, and compatible with, the processes used for the fabrication of bipolar transistors. For example a back gate (also known as bottom gate) of a JFET can be formed from the collector of a bipolar transistor. The drain and source are formed in the same fabrication step that is used to form the base region of the bipolar transistor.

JFETs can be formed as P channel or N channel devices. Ideally a FET would take no gate current. However real devices and especially N channel JFETs can enter regimes where the gate current rises significantly when the current density within the device is relatively large and the drain-source voltage of the device is large.

SUMMARY OF THE INVENTION

According to a first aspect of the present invention there is provided an electronic device including a junction field effect transistor having a drain and a source, each defined by regions of a first type of semiconductor interconnected by a channel, and in which a dopant profile at a side of the drain facing the channel has a region of reduced doping compared to a body of the drain.

It is thus possible to provide a structure, which can be regarded as a field reducing structure, contiguous or substantially contiguous with the drain and that extends the distance within the transistor over which an electric potential extends and which reduces the electric field gradient within the transistor.

According to a second aspect of the present invention there is provided a method of forming a junction field effect transistor having a drain, a source and a gate, wherein during a doping step to form the drain a mask is provided over a semiconductor material or substrate to define where the doping will occur, and the mask has a first aperture defining the position of the drain, and one or more additional apertures are provided adjacent or contiguous with the first aperture so as to define an additional doped region that, in the finished transistor, provides a region of reduced doping extending from a body region of the drain toward the channel, the region of reduced doping having lower levels of doping as compared to the body region of the drain.

It is thus possible, by doping through at least one restricted aperture near or extending from the aperture used to define the drain, to cause the depletion region around the drain in a working transistor to become extended and thereby reduce impact ionization, and in turn reduce gate current.

BRIEF DESCRIPTION OF THE DRAWINGS

The present invention will now be described, by way of non-limiting example only, with reference to the accompanying drawings, in which:

FIG. 7 is a plan view of a mask used to define the spatial extent of doping during the doping of the source and drain regions for a transistor in accordance with an embodiment of the present invention;

DETAILED DESCRIPTION OF PREFERRED EMBODIMENTS

Figure 1:
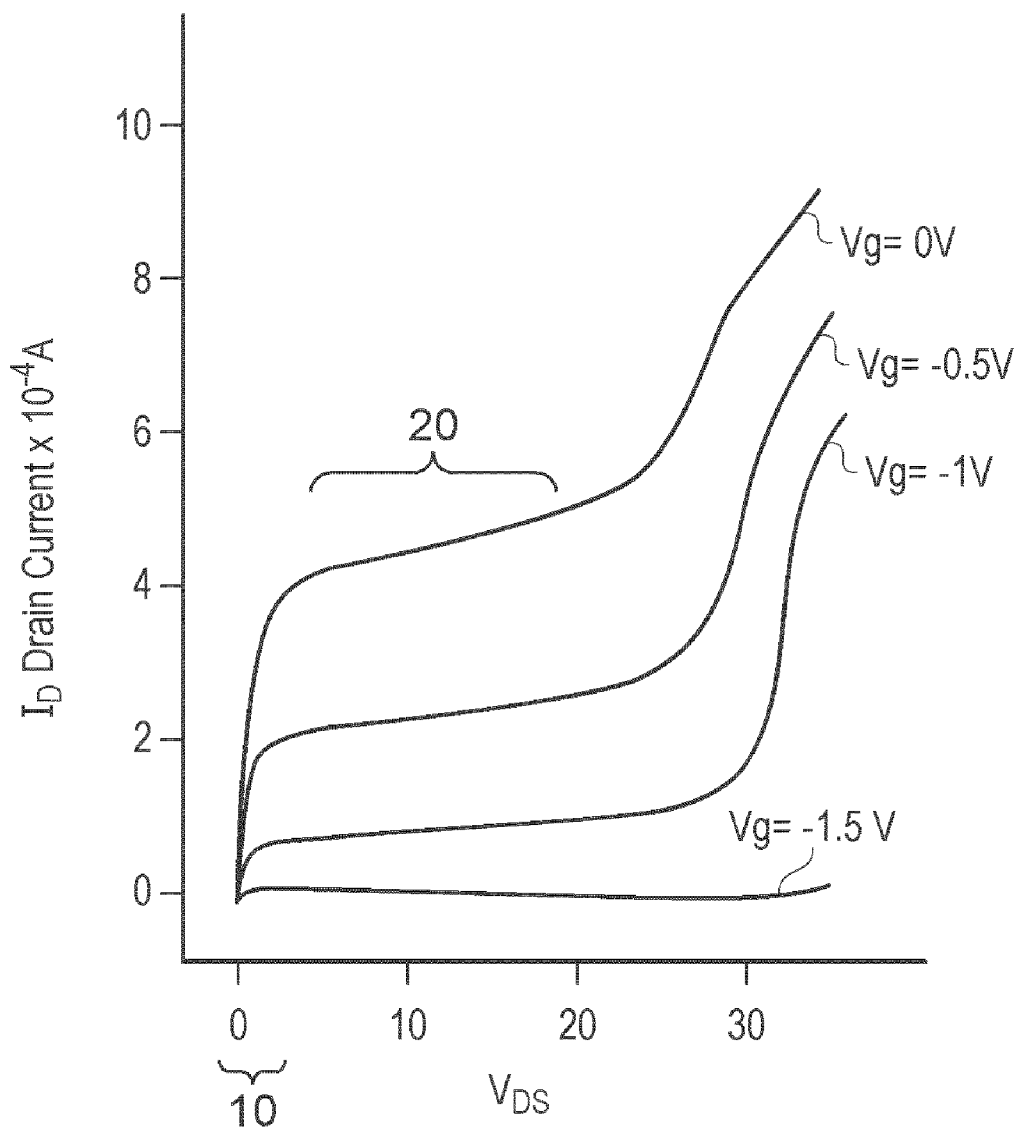
FIG. 1 is a plot of drain current versus drain-source voltage for an exemplary junction field effect transistor.

It is common to look at device characteristics for example as shown in FIG. 1, where a drain current $I_d$ of a JFET is plotted as a function of the drain-source voltage $V_{DS}$ for various gate voltages $V_G$. As can be seen, for small $V_{DS}$ the drain current $I_d$ rises rapidly in what is known as the "triode" region, generally indicated 10, where the device functions like a voltage controlled resistor. However, as $V_{DS}$ increases the transistor enters into the "pinch off" region, generally designated 20, where ideally the $I_d$ versus $V_{DS}$ characteristics would be horizontal so that the current was exclusively controlled by the gate voltage (this region of operation is also known as the "linear" region or mode), but in reality they have some gradient because the transistor is not able to function as an ideal constant current source.

Figure 2:
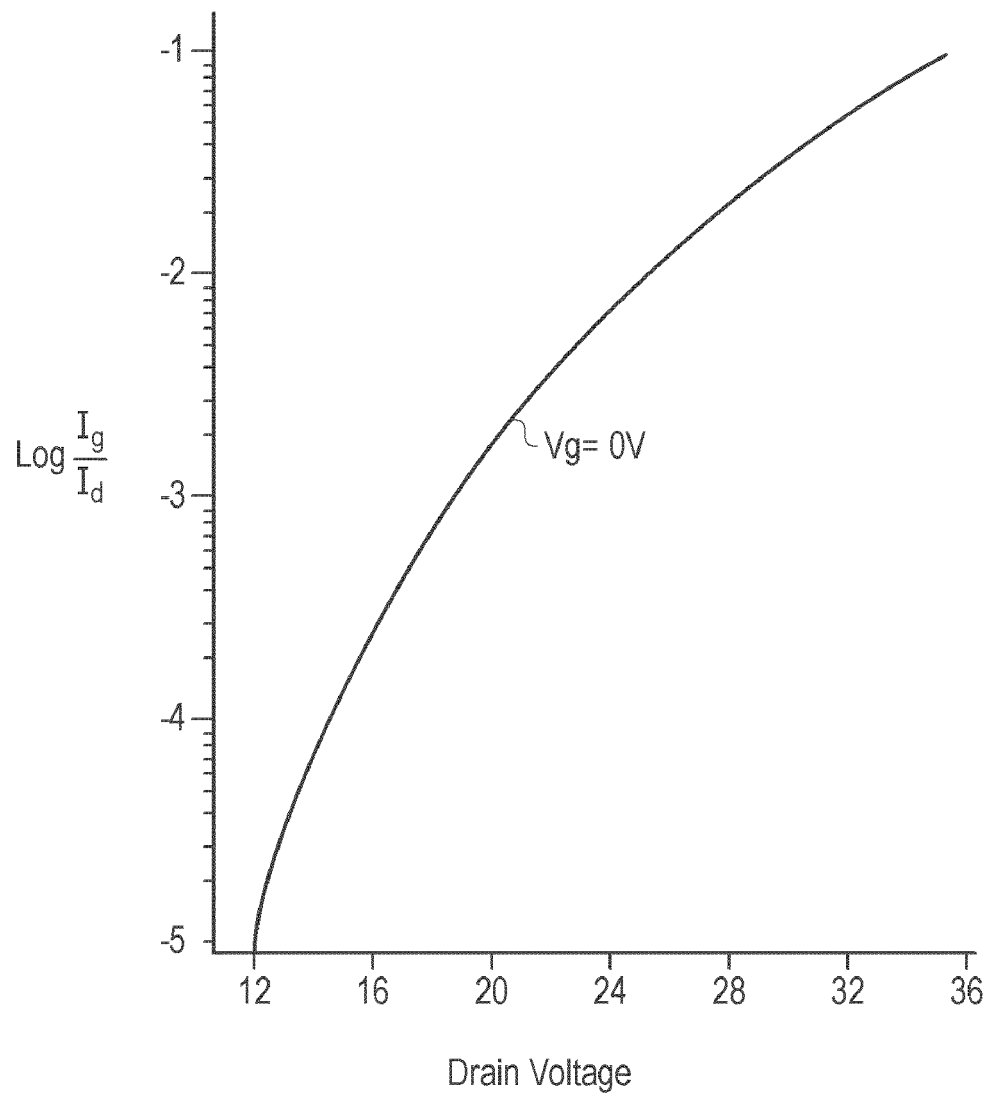
FIG. 2 is a logarithmic plot of the ratio of gate current to drain current as a function of fixed drain voltage for the exemplary transistor.

However, it is not so common to consider the gate current $I_g$. FIG. 2 plots the ratio of the gate current to the drain current, on a logarithmic scale, versus drain source voltage $V_{DS}$ for the same device as was characterized in FIG. 1 as the drain source voltage is swept from 12 to 36 Volts. It can be seen with a gate voltage $V_G=0$ (and the source held at 0V) that the gate current is less than one ten thousandth of the drain current at 14 volts drain-source voltage, but as $V_{DS}$ rises then the ratio $I_g/I_d$ rises until at $V_{DS}=36$ V the gate current $I_d$ has risen to 10% of $I_g$. This is undesirable.

It can be difficult for device and/or circuit designers to ensure that the transistor will not be subjected to large $V_{DS}$ voltages. This might occur because the JFET is at an input stage of an amplifier and the amplifier designer has no control over, or even knowledge of, the circuit or components preceding the amplifier.

Thus there is a desire to reduce the gate current that the JFET draws, even when subjected to large $V_{DS}$.

Figure 3:
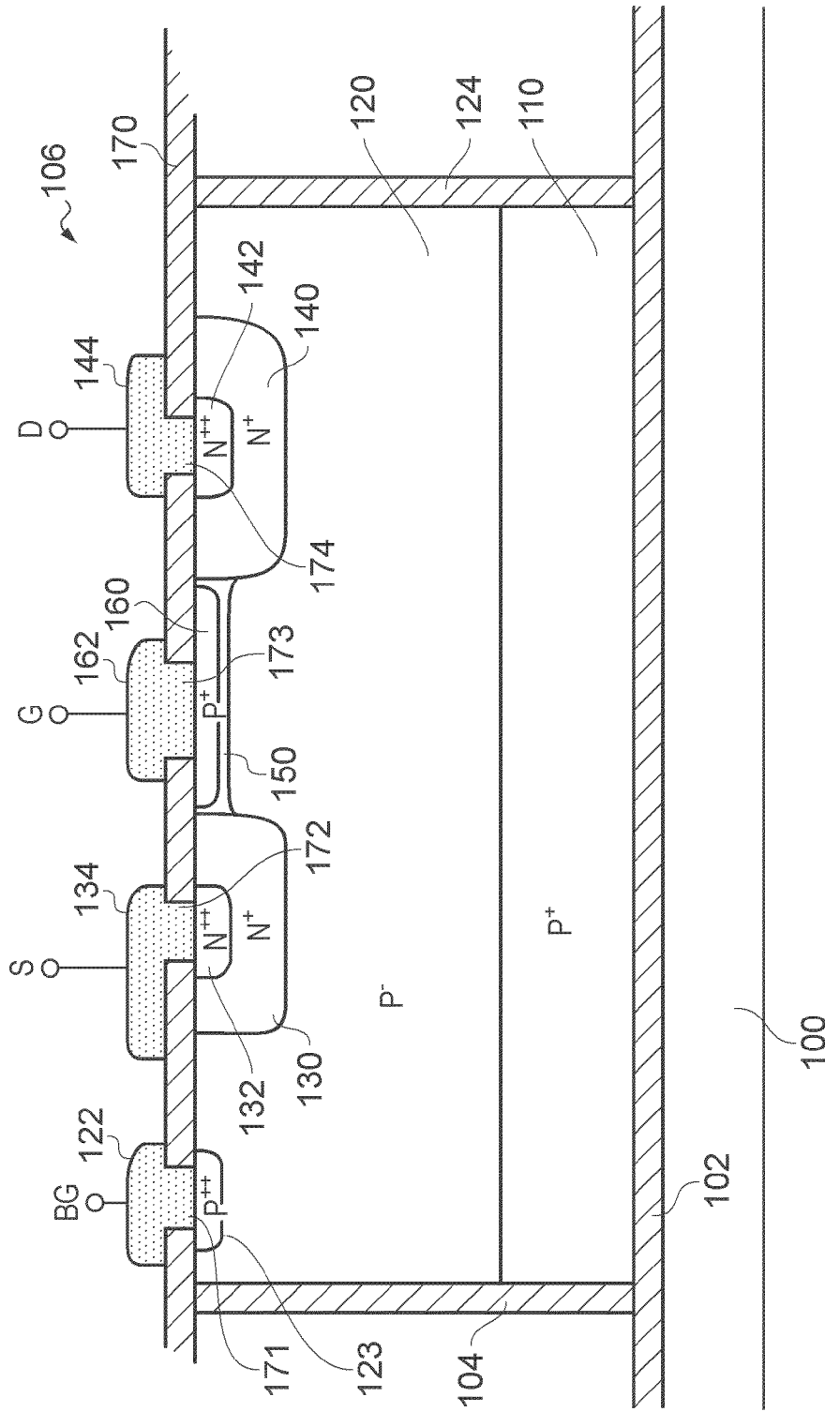
FIG. 3 is a schematic cross section of a prior art junction field effect transistor.

The increase in gate current is due to the impact ionization occurring within the device. In order to consider the impact ionization mechanism further it is worth reminding ourselves of the topology of a typical n channel JFET device. Such a device is shown in FIG. 3. In this description we are considering a single transistor, but it is to be understood that the transistor may only be one of many in an integrated circuit.

Terms such as above, below, over and so on as used herein refer to a device orientated as shown in the figures and should be construed accordingly. It should also be appreciated that because regions within a transistor are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader.

The device shown in FIG. 3 is a silicon on insulator (SOI) isolated well device. As such the device sits in its own "island" of semiconductor material, generally designated 106, which is formed in a well of insulation and is insulated from all other devices on the integrated circuit. In this embodiment a handle wafer 100 acts as a carrier substrate and has an insulating layer of silicon dioxide 102 formed thereon.

Side walls 104 (which also exist above and below the plane of the drawing) are also formed (typically of silicon dioxide) so as to isolate the island of silicon 106 in a well formed by layer 102 and walls 104, and the insulating walls running above and below the plane of the drawing and parallel to it. The process for forming the layer 102 and walls 104 is a standard fabrication process and need not be described here. In other arrangements, the well or island of semiconductor material can be junction isolated.

When forming an n-channel FET the island 106 of silicon usually comprises a bottom layer 110 of P$^+$ type semiconductor material (i.e., quite heavily doped P-type semiconductor, where the dopant is typically Boron) because this is a standard offering from semiconductor foundries that offer bipolar transistors as the P$^+$ layer is often beneficial in the operation of PNP bipolar transistors. This layer 110 could be omitted as it is not relevant to the present invention.

A further P layer 120 is formed above layer 110. This is deposited as an epiaxial layer and is often quite lightly doped (P$^-$). The layer 120 has a contact 122 formed at it surface so that it may act as the back gate of the JFET. An interface region 123 may be provided as a very heavily doped region, designated P$^{++}$ in the Figures. Source and drain regions 130 and 140 are formed by doping the semiconductor material with N$^+$ type material. The dopant is typically phosphorous (though other N-type dopants can be used) and the doping level is quite high, typically around $10^{17}$ atoms per cm$^3$. Regions of even higher doping 132 and 142 are provided to form contact regions with metal conductors 134 and 144, respectively. These regions are often Arsenic doped. A channel region 150 is provided which is also N doped, but at a lesser concentration, such as around one third ($3 \times 10^{16}$ atoms per cm$^3$) of the concentration of the source and drain. A gate 160 formed of a thin layer of the P-type material (typically Boron doped) is formed above the channel 150 and may be connected to a gate electrode 162, as illustrated. The interface between the gate electrode 162 and the gate 160 may be via a heavily doped P$^{++}$ region so as to avoid forming a Schottky contact. Alternatively, and just as validly the gate electrode 162 can be omitted, and the gate region 160 can extend out of the plane of the drawing to connect with the back gate 120. Thus the back gate 120 and the gate 160 can effectively form one same region of semiconductor material. This constructional change does not alter the discussion about the way the device works.

A layer of insulator 170 is formed over the device, with through holes 171, 172, 173 (if a discrete gate connection is provided) and 174 to enable the metal conductors to contact the back gate, source, gate and drain regions respectively.

In the completed device the gate electrode 162 (also known as the top gate) is generally connected to the back gate 120, or as mentioned above, the gate 160 may actually be the same region as the back gate layer 120. Both configurations electrically connect the gate and back gate.

Figure 4:
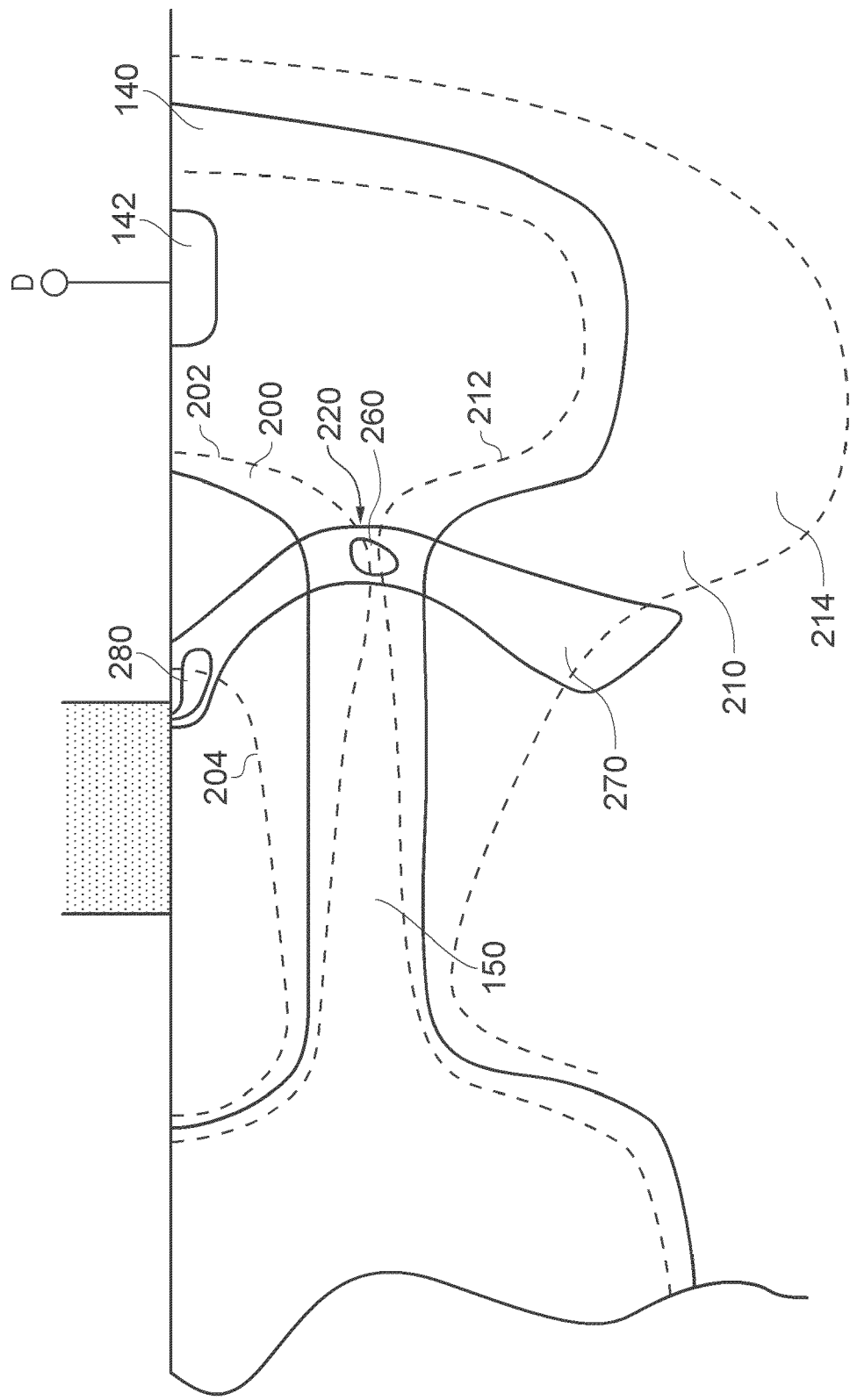
FIG. 4 schematically illustrates the extent of the depletion layer in the device shown in FIG. 3 at a drain voltage of 36 Volts.

In use the drain current flows between the source 130 and the drain 140 along the channel 150. The effective depth of the channel varies with distance from the source 130 to the drain 140, as shown in FIG. 4, because of the existence of a first depletion region 200, notionally delimited by broken lines 202 and 204, and a second depletion region 210 notionally delimited by broken lines 212 and 214, due to the applied voltage as is well known to the person skilled in the art.

However once a FET has reached its linear mode, pinch off occurs near the drain 140 of the transistor and results in most, but not all, of the channel around the pinched off section being in the depletion region and hence being non-conducting. This current flow is concentrated in the remaining conducting portion, generally designated 220, of the channel 150 that exists between the depletion regions. It also follows that the electric field gradients are highest at this region of the channel. FIG. 4 also shows calculated current densities in a device with $V_{DS}$=36 Volts, but these should be considered in conjunction with FIG. 5.

Figure 5:
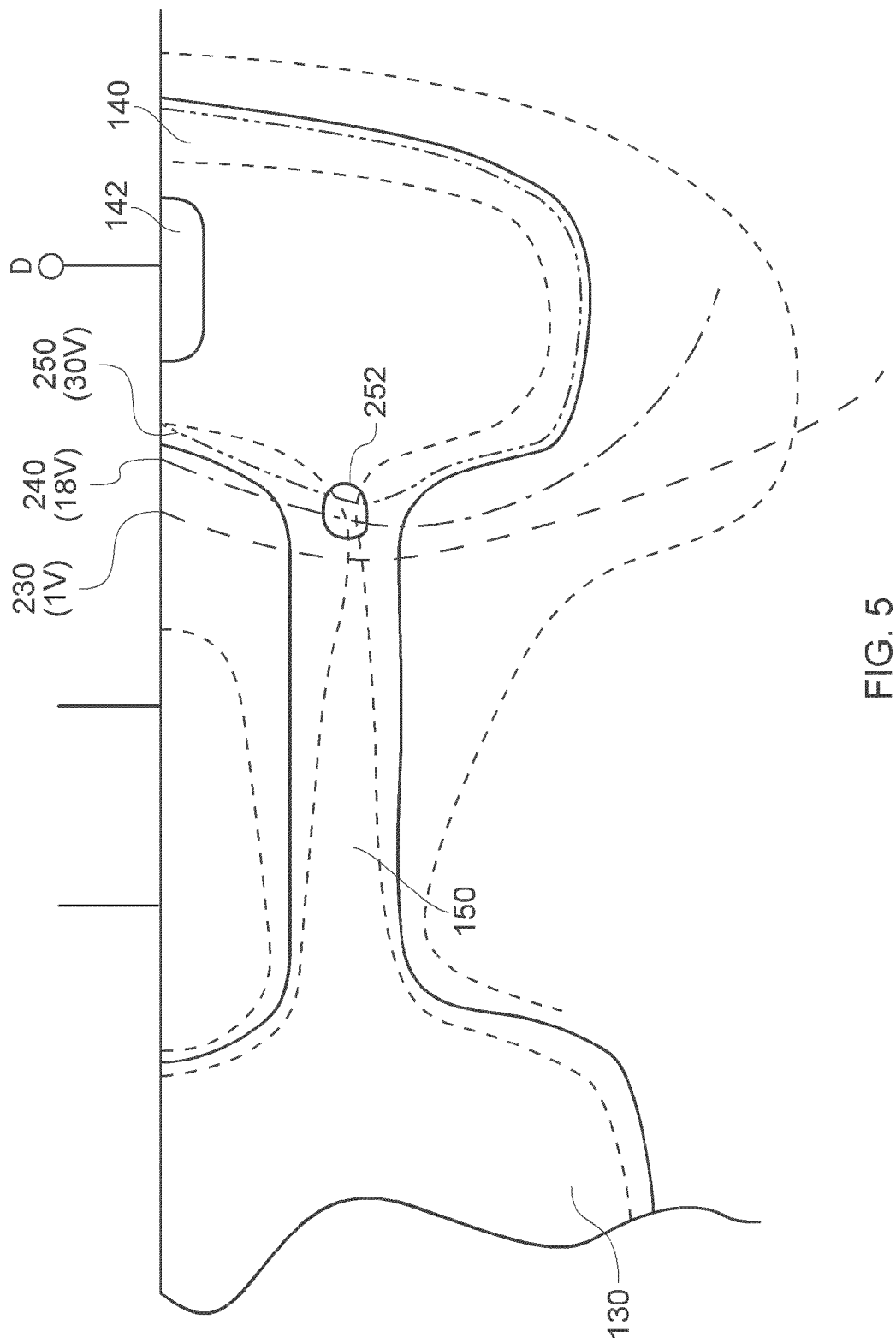
FIG. 5 schematically shows equi-potentials within the device shown in FIG. 3 at a drain voltage of 36 volts.

The potential gradient varies significantly within the device. FIG. 5 shows simulated potentials (i.e. voltage) within the device shown in FIG. 4. The boundaries of the depletion layers are also shown, as they were in FIG. 4. Lines of equi-potential are also illustrated. For this device, where 36 volts is applied to the drain terminal and the gate is at −4V, most of the device is below 1V (i.e., to the left of line 230). The voltage starts to change rapidly towards the pinched off region 220 (FIG. 4) of the channel, as shown by the closeness of the line of equi-potential 240 representing a potential of 18 volts, and the line 250 representing a potential of 30 volts. This it can be seen that the bulk of the voltage across the device is dropped across a small distance, generally designated 252, near the edge of the drain 140.

Returning to FIG. 4 we see the strongest region of voltage change coincides with the highest region of current density, as denoted by region 260. This give rise to impact ionization of atoms in this region 260 due to the combination of high current densities (possibly in the vicinity of 100 A cm$^{-2}$) and the strongest electric field gradients. This impact ionization rips carriers from the atoms and gives rise to an additional current flow in region 270, which concentrates towards the edge of the gate to give rise to further region 280 where additional impact ionization occurs. This gives rise to a device generated gate current flow. This device generated gate current flow is the reason that the gate current rises so significantly as the drain voltage rises.

The inventors realized that controlling the onset of impact ionization around the pinch off region of the channel would not only improve the transistor breakdown voltage, but would also reduce the gate current. This significantly enhances the effective input impedance of the device, thereby increasing its utility.

In general, the depletion region extends a relatively "short" distance from the notional boundary of a heavily doped P-N junction, but extends much further around the boundary of a less heavily doped P-N junction. Of course, regions in a real transistor are heavily doped for a reason, and that reason is to control their current carrying capacity per unit area. Put simply, heavily doped regions conduct much better than less doped regions. Consequently changing the doping applied during the fabrication of a transistor would significantly alter the transistor's electrical properties.

In accordance with an embodiment, the dopant profile in the drain region is changed to cause the dopant concentration to be reduced on the side of the drain region facing towards the channel.

Figure 6:
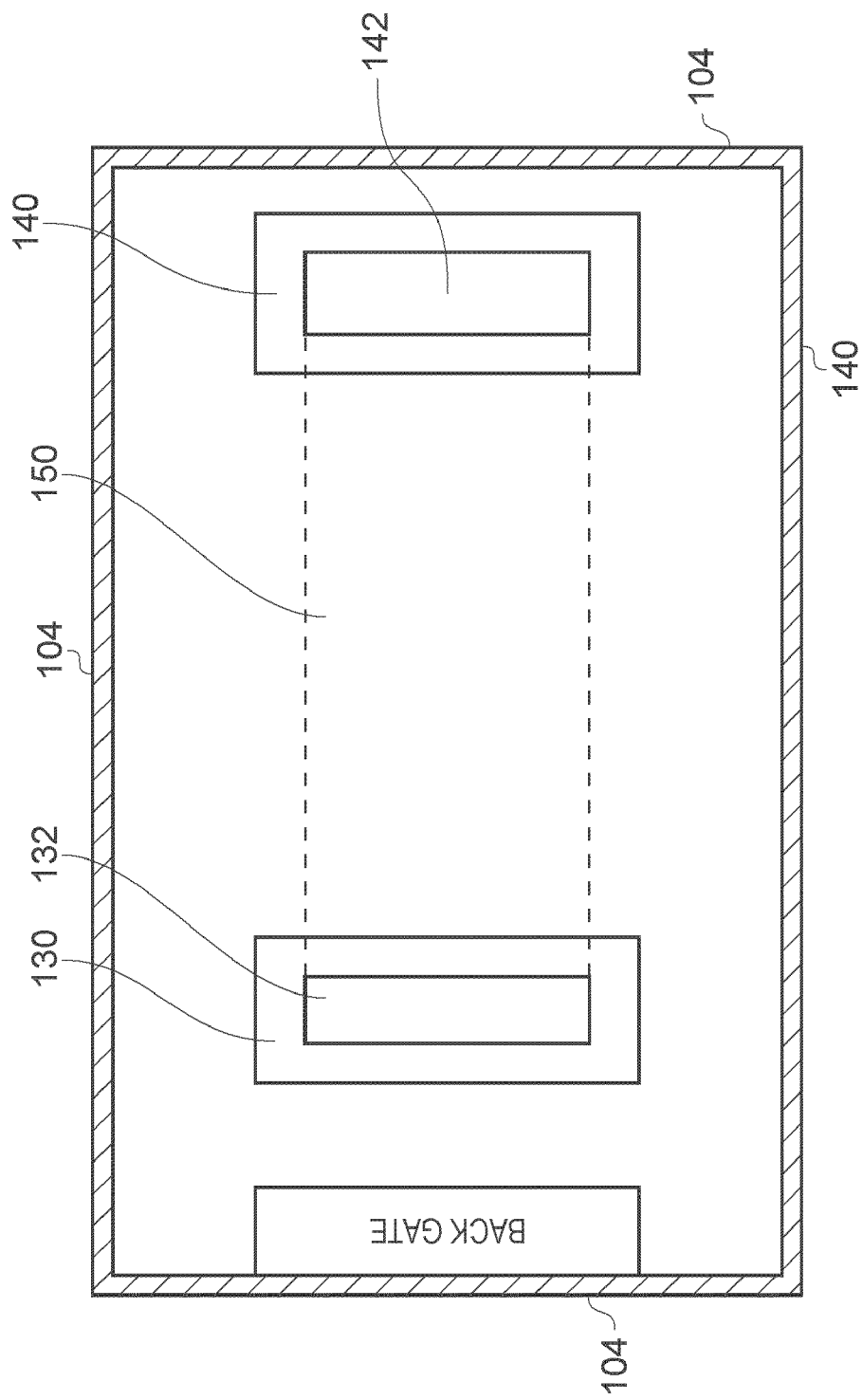
FIG. 6 is a schematic plan view of the transistor shown in FIG. 3.

FIG. 6 shows, in plan view, some of the semiconductor regions of a horizontally formed JFET of the type illustrated in FIG. 3. The channel 150 is shown in outline as it exists below the upper surface of the transistor. A region of semiconductor material above the channel forms the gate, and extends on either side of the channel where it joins the region 120 (see FIG. 3) that forms the back gate. Thus the gate and the back gate can be treated, electrically, as one and the same. The oxide layer and electrical contacts above the surface of the transistor have been omitted for clarity. During fabrication of the source and drain regions 130 and 140, a mask is deposited on the surface of the semiconductor with apertures in the mask occurring where the drain and source, respectively, are to be formed—these apertures roughly correspond in location to slots 302 and 304, shown in FIG. 7.

FIG. 7 illustrates a mask 300 for use in a modified fabrication process in accordance with an embodiment of the present invention. The mask 300 is modified to include additional apertures 310 adjacent aperture 302, which defines the drain, and on the side of that aperture 302 which faces towards the source and the channel of the transistor in the ultimately fabricated transistor.

Figure 8A:
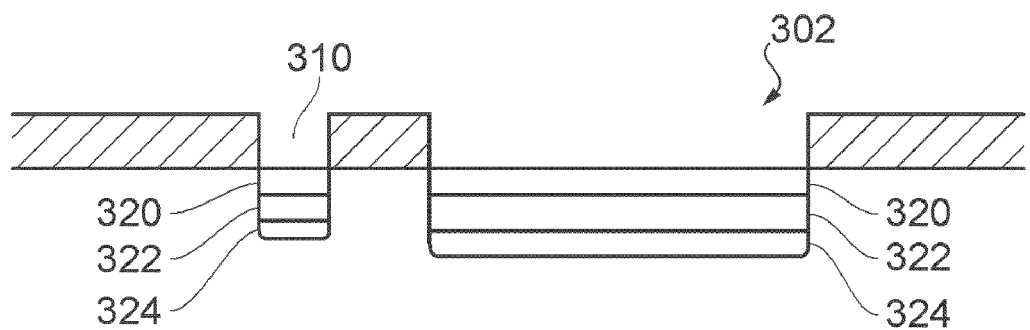
FIG. 8*a* shows the doping profile after a doping step has been performed in accordance with an embodiment.

During the implantation step, the N type doping is implanted into the semiconductor material (usually silicon) beneath the apertures 302, 304, 310 in the mask 300, with the dopant concentration being greatest at the surface of the wafer and reducing with depth from the surface. Thus beneath the aperture 302, region 320 (FIG. 8a) has a higher dopant concentration than region 322 which in turn has a higher concentration than region 324. Similar regions 320, 322 and 324 exist beneath aperture 310, but where the aperture is small then edge effects mean that the dopants may not extend quite as deeply into the semiconductor material compared to wider apertures such as the aperture 302 defining the drain.

Figure 8B:
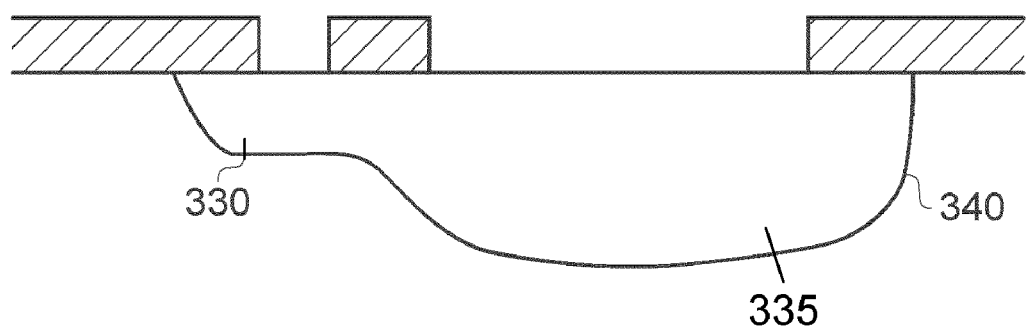
FIG. 8*b* shows the doping profile after a thermal diffusion step has been performed on the structure of FIG. 8*a*.

After implantation the semiconductor is heat treated to cause the dopants to diffuse, as shown in FIG. 8b. The diffusion distance is a function of temperature and time, as well as concentration. The maximum spacing between the apertures 302 and 310 is selected to be comparable with (and typically less than) the diffusion distance for the heat treatment. As a result the implantations beneath apertures 302 and 310 diffuse into one another, with the spaced apart apertures 310 giving rise to an extended region of reduced doping 330, which can be regarded as a field reducing region, compared to the corresponding "edge" 340 on the other side of the drain 140. The skilled artisan will appreciate, of course, that the "edges" described herein are not sharp edges due to the blurring effects of diffusion. In other words, the dopant profile at the opposite edge 340 of the drain is tapered only by the effects of diffusion, whereas the dopant profile in the region of reduced doping 330 is tapered by both the same diffusion effect and the reduced overall doping available at this end due to the structure of the spaced apart apertures 310, and is thus more gradually tapered. Thus, the region of reduced doping 330 has reduced doping relative to the doping profile in the main or body region 335, which in the illustrated embodiment is closer to the edge 340 at the opposite side of the drain 140 facing away from the channel. That body region 335 will tend to have similar doping levels and depths as the source region on the other side of the channel.

The conductivity type and maximum doping concentrations are approximately the same in both the region of reduced doping 330 and the body region 335, because they are both formed with the same mask and with the same doping (e.g., implantation) step. However, because the doping extends to a lesser depth into the semiconductor material in the region of reduced doping 330, as compared to the body region 335, the number of doping atoms and the per area doping concentration in the region of reduced doping 330 is less than in the body region 335. This reduces the electric field gradients in the vicinity of the pinch off region resulting in the substantial elimination, or at least a significant reduction, of impact ionization in the region 260 shown in FIG. 4, and consequently a reduction in the gate current from around 10% of the drain current to less than 5%, e.g., around 2%, at a drain source voltage of around 36 volts. The apertures 310 in this example are about nominally 1 micron square and have their center displaced from the edge of the source by about 1.5 microns.

Figure 9:
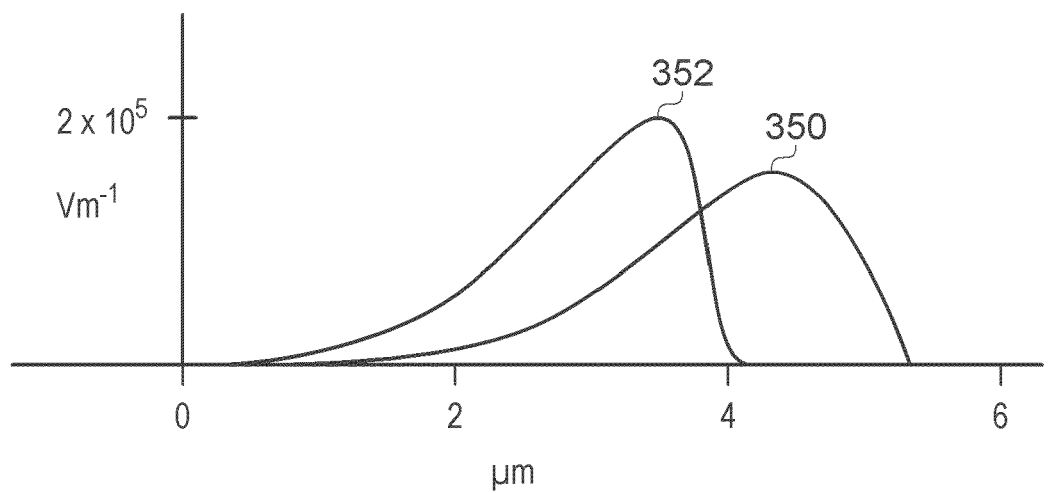
FIG. 9 is a plot showing electrostatic field gradients inside a prior art transistor and a transistor constituting an embodiment of the present invention.

FIG. 9 compares the field gradients as a function of distance within a device having a field reducing region formed by implanting through the apertures 310 compared to an identically sized device where the apertures 310 are not provided in the mask, and hence the field reducing implant at the side of the drain is not performed. It can be seen that the peak field as indicated by 350 is reduced by about 25% for a transistor constituting an embodiment of the present invention compared with the peak 352 for a similarly sized prior art transistor.

The extra diffusions need not be limited to squares and could be performed using any shape that gives an effective modification of the dopant profile. Thus circles of varying sizes, a line or multiple lines of differing widths and/or separations or even triangular patterns could be employed. However, fabrication facilities tend to prefer shapes defined in orthogonal, i.e., notionally horizontal and vertical directions, and hence rectangular shapes are preferred.

Figure 10A:
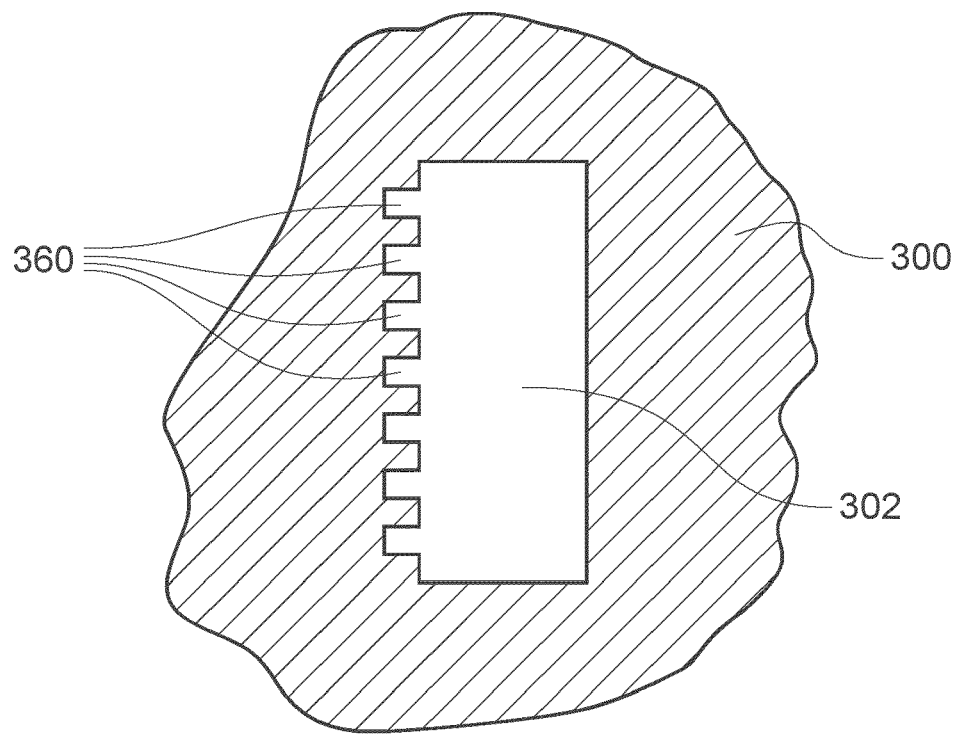
FIGS. 10*a* and 10*b* illustrate alternative mask patterns for fabricating a transistor in accordance with embodiments of the present invention.
Figure 10B:
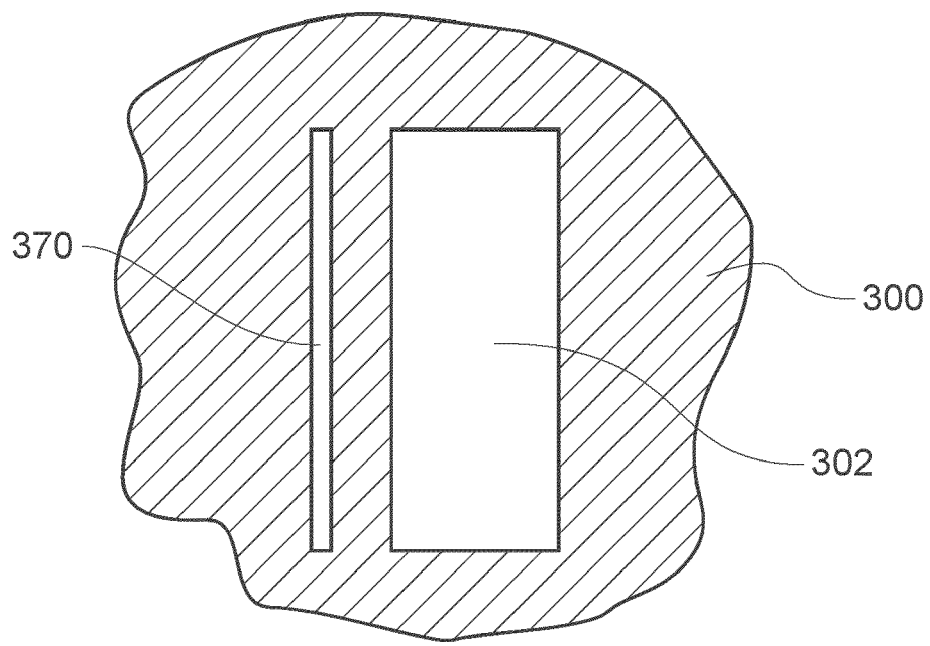

FIG. 10a shows a mask where the additional apertures 360 are contiguous with the drain aperture 302. In FIG. 10b a similar doping profile is achieved by the inclusion of a narrow slit 370 in the mask 300.

In FIG. 10a and FIG. 7 the apertures 310, 360 extend along a path, and provide spatial modulation of the doping profile, in a direction parallel to the edge of the drain. In each of the three illustrated examples, the aperture(s) 310, 360, 370 and the resultant region of reduced doping extend(s) along a path or in a pattern proximate the drain that crosses (e.g., orthogonal to) the axis of the channel.

As a further alternative the apertures 310 or slit 370 could be defined by a mask that differs from the one used to define the position of the drain. Thus the implantation of doping could if desired be performed in two steps.

It is thus possible to provide an improved JFET having reduced gate current.

Transistors and methods for forming the same as described herein can be implemented in various electronic devices. Examples of the electronic devices can include high speed signal processing chips, power regulators, memory chips, memory modules, circuits of optical networks or other communication networks, and disk driver circuits. Products in which such electronics can be incorporated include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of forming a junction field effect transistor having a drain, a source and a gate, the method comprising:
providing a mask over a semiconductor to define where the doping will occur, wherein the mask has a first aperture defining the position of the drain, and at least one additional aperture is provided adjacent or contiguous with the first aperture so as to define an additional doped region that, in the finished transistor, provides a region of reduced doping extending from a body region of the drain toward a channel of the junction field effect transistor, the region of reduced doping having lower doping levels as compared to the body region of the drain; and
doping the body region of the drain and the additional doped region via the mask with a single doping step.

2. The method as claimed in claim 1, in which the mask comprises a plurality of the additional apertures are provided in a spatially modulated pattern.

3. The method as claimed in claim 2, in which the plurality of additional apertures are spatially modulated in a direction parallel to a longitudinal direction of the drain.

4. The method as claimed in claim 3, further comprising diffusing dopants in the drain region and dopants in the additional doped region, thereby creating the region of reduced doping contiguously with the drain.

5. The method as claimed in claim 4, in which the at least one additional aperture is separated from the first aperture by less than a diffusion distance for the diffusing.

6. The method as claimed in claim 1, in which the first aperture is a single aperture that defines the entire body region of the drain.

7. The method as claimed in claim 1, in which the mask further comprises a second aperture to define the position of the source without corresponding adjacent additional apertures.

* * * * *